(12) United States Patent
Irie

(10) Patent No.: US 7,071,455 B2
(45) Date of Patent: Jul. 4, 2006

(54) OPTICAL RECEIVER

(75) Inventor: Takeshi Irie, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 168 days.

(21) Appl. No.: 10/727,975

(22) Filed: Dec. 5, 2003

(65) Prior Publication Data

US 2004/0169129 A1 Sep. 2, 2004

(30) Foreign Application Priority Data

Dec. 5, 2002 (JP) .............................. 2002-354187

(51) Int. Cl.
*G01J 1/44* (2006.01)

(52) U.S. Cl. ................................ 250/214 R; 250/214.1

(58) Field of Classification Search ............ 250/214 R, 250/214.1, 214 A, 214 LA, 214 LS
See application file for complete search history.

(56) References Cited

U.S. PATENT DOCUMENTS 5,075,627 A * 12/1991 Bodig et al. ................. 324/384
6,034,518 A * 3/2000 Yuasa .......................... 323/316
6,188,059 B1 * 2/2001 Nishiyama et al. ..... 250/214 R
6,333,804 B1 * 12/2001 Nishiyama et al. ......... 398/202

* cited by examiner

*Primary Examiner*—Georgia Epps
*Assistant Examiner*—Brian Livedalen
(74) *Attorney, Agent, or Firm*—Smith, Gambrell & Russell, LLP

(57) ABSTRACT

The present invention provides an optical receiver in which a signal detection level is independent on whether a ammeter is connected to a current monitor terminal or not. The optical receiver comprises a photo diode, a first current mirror circuit connected to the photo diode and a second current mirror circuit. The second current mirror circuit has a pair of current path, one of which is connected to the first current mirror circuit and the other of which is connected to the voltage source provided within the optical receiver. The voltage source supplies a bias whether an ammeter is connected to the other of the current path or not. Therefore, the signal detection level attributed to one of the current path is unchanged.

5 Claims, 2 Drawing Sheets

OPTICAL RECEIVER

BACKGROUND OF THE INVENTION

1. Field of the Invention

This invention relates to an optical data link, especially a light-receiving circuit used in the optical data link.

2. Related Prior Art

A conventional optical data link that uses a monitoring circuit of photo current generated by an optical device is disclosed in the U.S. Pat. No. 6,188,059. The disclosed monitoring circuit detects a current proportional to the photo current flowing in the optical device, such as a photo diode, by a current-mirror circuit.

On the other hand, a signal detection circuit may be provided in the conventional optical data link. The signal detection circuit detects through the photo current whether an optical signal is inputted into the photo diode or not. This signal detection circuit may be provided in one current path different to a path for monitoring current of the current-mirror circuit.

However, in the configuration above mentioned where the signal detection circuit and the current monitoring circuit are provided in respective path of the current-mirror circuit, some inconvenience described below may occur. When an ammeter is connected to one terminal for current monitoring of the current-mirror circuit, some bias voltage will be applied to the terminal. On the other hand, when any current monitoring is not necessary and accordingly any circuit is not connected to the terminal for current monitoring, no bias voltage will be applied, which affects conditions of the signal detection. Thus, the signal detection circuit may depend on conditions of the paired path of the current-mirror circuit. When the photo diode is an avalanche photo diode (herein after denoted by APD), the magnitude of the current flowing the current-mirror circuit must be as small as possible to save the power consumption of the power source that supplies the bias voltage to the APD. Accordingly, the conditions of the current path of the current-mirror circuit remarkably affect the signal detection.

SUMMARY OF THE INVENTION

One object of the present invention is to solve problems above mentioned and to provide an optical receiver in which the signal detection level is unchanged whether any external function is connected to the current monitoring terminal or not.

According to one aspect of the present invention, an optical receiver comprises a photo diode, a first current mirror circuit, second current mirror circuit and a voltage source. The first and second current mirror circuit each has a pair of current path. One of the paired current paths of the first current mirror circuit is connected to the photo diode. The other of the current path of the first current mirror circuit is connected to one of the current path of the second current mirror circuit. The one of the current path of the second current mirror circuit is also connected to a signal detection circuit. The other of the current path of the second current mirror circuit provides a voltage source and is brought out of the optical receiver as a current monitor terminal.

Since the voltage source is connected to the other of the current path of the second current mirror circuit and supplies a bias to the current path regardless of whether any external function is connected to the current monitor terminal or not, the signal detection circuit connected to one of current paths of the second current mirror circuit is unchanged.

The voltage source preferably includes a power supply and a diode. The voltage source further includes a first and second resistors serially connected to each other for dividing a potential of the power supply. The diode is connected to the first and second resistors. The bias supplied from the voltage source is preferably greater than 1.5V and smaller than 2.5V. When the external function connected to the current monitor terminal is smaller than 2.5V, the bias supplied from the voltage source becomes dominative, thereby stabilizing the signal detection circuit connected to one of current paths of the second current mirror circuit. When the external function is greater than 2.5V in its voltage, the external function becomes a dominative bias source for the other current path of the second current mirror circuit, which does not affect the signal detection circuit.

The photo diode is preferably an avalanche photo diode and the optical receiver may further include a high voltage source for supplying a bias potential to the avalanche photo diode. Both current paths of the first current mirror circuit are connected to the high voltage source and other end of the one current path is connected to the avalanche photo diode. Thus, the avalanche photo diode is biased by the high voltage source through the first current mirror circuit. Since the signal detection circuit and the current monitor terminal are connected to the high voltage source through the first and second current mirror circuits, the potential levels thereof are controlled to a level comparative to an output level of the module even the avalanche photo diode is biased at high voltage.

DETAILED DESCRIPTION OF PREFERRED EMBODIMENTS

Figure 1:
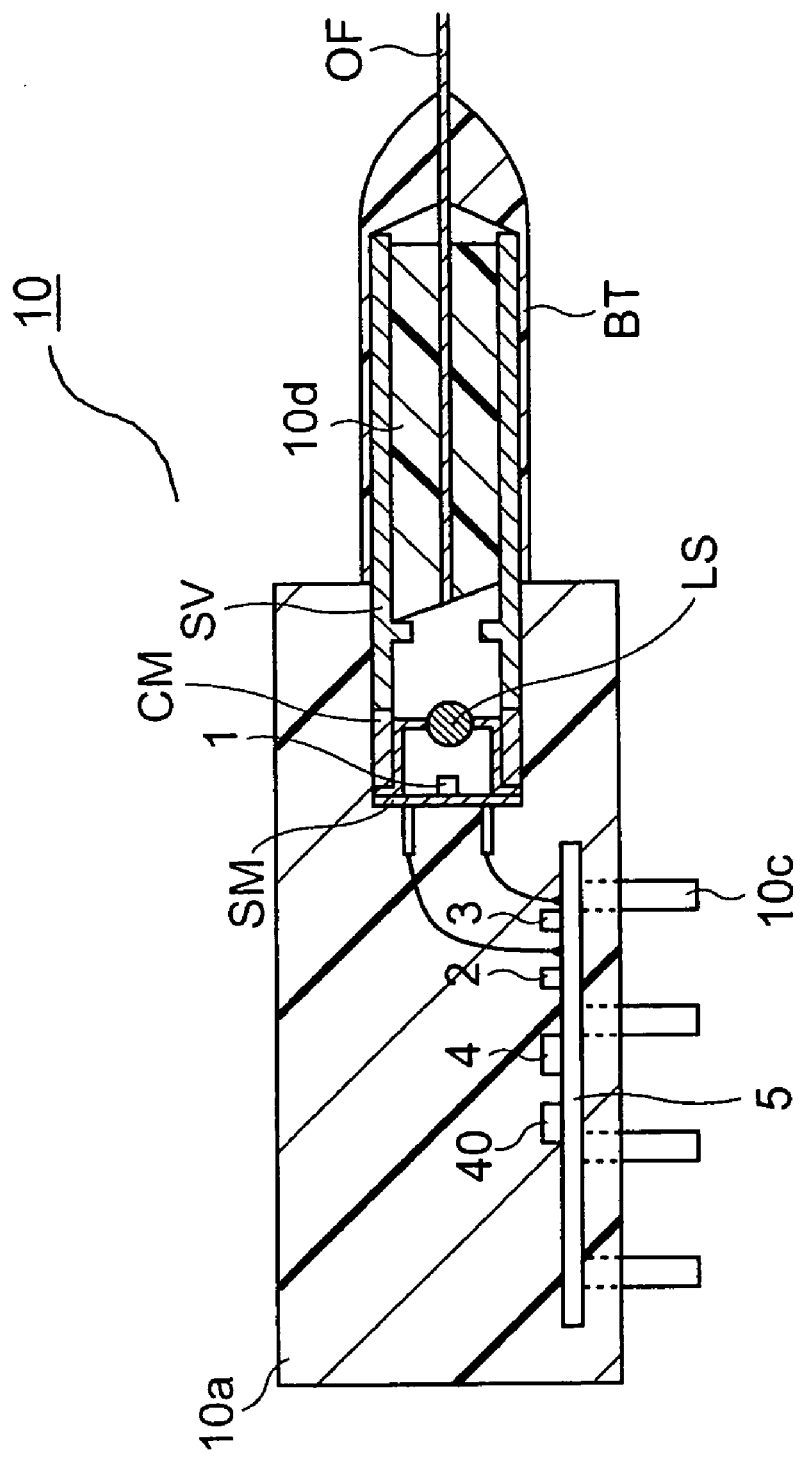
FIG. 1 is a cross sectional view of the optical receiver.

A preferred embodiment of an optical receiver having a light-receiving circuit according to the present invention will be now described as referring to accompany drawings. In the drawings, elements identical to each other will be referred to with numerals identical to each other without overlapping explanations.

FIG. 1 is a cross sectional view of an optical receiver 10 according to the present embodiment. The optical receiver 10 comprises a sleeve SV and a ferrule 10d; both are encapsulated in a mold resin 10a. In the ferrule 10d, an optical fiber OF is disposed. An end surface of the optical fiber OF in the sleeve SV faces to an avalanche photo diode (APD) 1. The APD is fixed on a stem SM, which seal an opening of the sleeve SV, and receives light emitted from the optical fiber OF through a lens LS secured within the sleeve SV.

A DC-DC converter 40, which converts a direct-current bias to another direct-current bias and control a multiplication factor of the APD 1, a current-mirror circuit 2, a trans-impedance amplifier 3 and a data-recovery/clock-recovery circuit are provided on a substrate 5. The substrate and electrical components described above are also molded by the resin 10a.

One terminal of the APD 1 is connected to the DC-DC converter 40 and the other terminal thereof is connected to the trans-impedance amplifier 3. The bias to the APD 1 is adjusted by the DC-DC converter. Inputting light from the optical fiber OF to the APD 1, a photo current, a magnitude of which depends on the magnitude of the light, is generated by the APD 1. This photo current is led to the trans-impedance amplifier 3 and is converted to a voltage signal corresponding to the input light.

The voltage output of the trans-impedance amplifier 3 is led to the data-recovery/clock-recovery circuit 4. The data-recovery/clock-recovery circuit 4 extracts a data signal and a clock signal both involved in the output of the trans-impedance amplifier. The data-recovery/clock-recovery circuit may involve a main amplifier.

Figure 2:
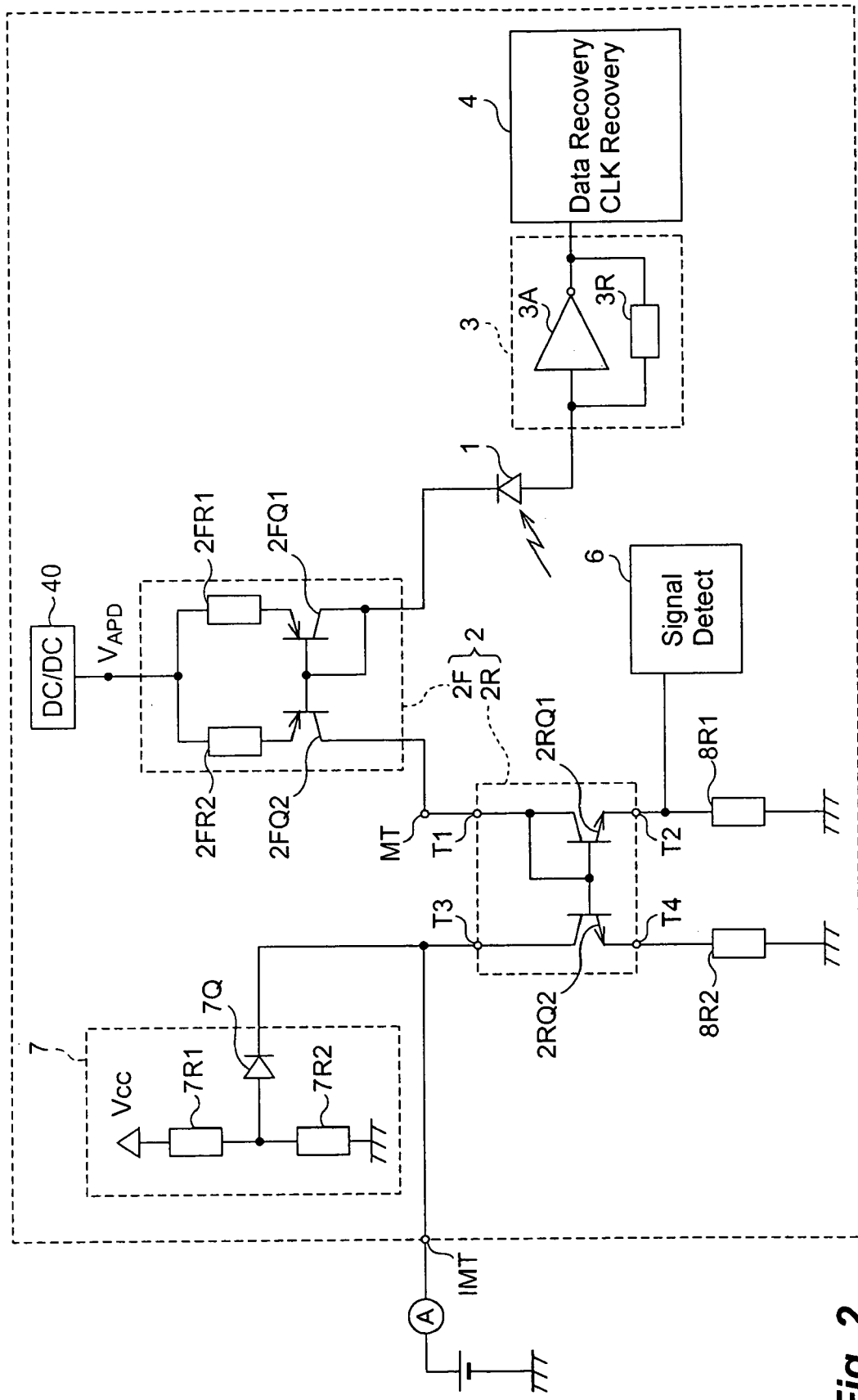
FIG. 2 is a circuit diagram of the optical receiver.

FIG. 2 is a circuit diagram of the light-receiving circuit described above. The current-mirror circuit 2 comprises a first current-mirror circuit 2F and a second current-mirror circuit 2R, serially connected to each other. Each current-mirror circuit involves a pair of current path and operates as to keep the ratio of the magnitude of the current passing each current path constant. When two transistors provided in respective current path of the current-mirror circuit are equal to each other in their size, the ratio of the magnitude of the current is inversely proportional to the resistance ratio of two resistors provided in respective current path. Two transistors are disposed side by side to suffer the same ambient condition, especially ambient temperatures.

Since the APD is operated under the reverse bias condition, a voltage drop due to the current mirror circuit is preferable as small as possible to supply a sufficient bias to the APD 1. The voltage drop of the current mirror circuit depends on the base-emitter bias condition of the transistor constituting the current mirror circuit, which is equivalent to a cramped condition of the forward biased diode. Under the forward biased condition of the diode, the saturated voltage is nearly 0.6V to 0.7V. Therefore, the cathode potential of the APD 1 becomes $V_{APD}-(0.6\sim0.7)$, thereby providing a sufficient bias to the APD 1.

The first current mirror circuit 2F comprises a pnp-type transistor 2FQ1, whose a collector and a base are short-circuited to each other, and another pnp-type transistor 2FQ2 substantially equivalent to the other transistor 2FQ1. Bases of two transistors 2FQ1 and 2FQ2 are connected to each other and emitters thereof are connected to the bias $V_{APD}$. Between the bias $V_{APD}$ and respective emitters, two resistors 2FR1 and 2FR2 are provided in respective current path, which determines the ratio of the current flowing respective path. When the resistance of two resistors 2FR1 and 2FR2 are equal to each other, the current flowing respective transistors 2FQ1 and 2FQ2 become equal to each other.

One path of the first current mirror circuit 2F thus configured is connected to the APD 1, while the other path thereof is connected to another current mirror circuit 2R through the terminal MT. Inputting light to the APD 1, a current corresponding to the photo current flows from the terminal $V_{APD}$ through the transistor 2FQ1 to the APD 1, and a current, the magnitude of which is equal to the current flowing the transistor 2FQ1, flows from the terminal $V_{APD}$ into the second current mirror circuit 2R.

The photo current generated by the APD 1 is converted to the corresponding voltage signal by the trans-impedance amplifier 3. An amplifier 3A, in which active devices, such as field effect transistors, made of gallium arsenide may be involved, constitutes the trans-impedance amplifier 3.

The second current mirror circuit 2R comprises a npn-type transistor 2RQ1 whose collector and base are short-circuited, and another npn-type transistor 2RQ2 substantially equivalent to the other npn-type transistor 2RQ1. Bases of two transistors 2RQ1 and 2RQ2 are connected to each other. The collector of the transistor 2RQ1 is connected to the first terminal T1 of the second current mirror circuit 2R and the emitter thereof is connected to the second terminal T2, while the collector of another transistor 2RQ2 is connected to the third terminal T3 and the emitter thereof is connected to the fourth terminal T4, respectively. The first terminal T1 is connected the terminal MT for monitoring current.

Two resistors 8R1 and 8R2 are connected to the second T2 and fourth T4 terminals of the second current mirror circuit 2R, while the other terminal of respective resistors 8R1 and 8R2 are grounded. The resistance of two resistors 8R1 and 8R2 defines the ratio of the current flowing respective transistors 2RQ1 and 2RQ2. When the resistance of two resistors are equal, the current flowing two transistors 2RQ1 and 2RQ2 becomes equal. A signal detection circuit 6 is connected to the second terminal T2 of the second current mirror circuit 2R. The signal detection circuit detects whether the APD 1 receives signal light or not.

The third terminal T3 is connected to a voltage source 7. The voltage source supplies a predetermined bias to the third terminal of the second current mirror circuit. Further, a current monitoring terminal IMT is connected to the third terminal of the second current mirror circuit 2R. An exemplary configuration of the voltage source 7 is constituted by two resistors and a diode. Namely, the power supply Vcc is divided by two resistors 7R1 and 7R2, and the divided bias is applied to the third terminal T3 through a diode 7Q.

According to the present circuit configuration, the current with a predetermined ratio to the current flowing into the APD 1 flows into the second current mirror circuit 2R, and in the second current mirror circuit, the current flowing in another transistor 2RQ2 has a constant ratio to the current flowing in the transistor 2RQ1. Therefore, the current flowing in the APD 1 is reflected to the current flowing in the another transistor 2RQ2, which enables to monitor the photo current at the current monitoring terminal IMT by connecting an ammeter thereto. Further, since the current with a constant ratio to the photo current flows in the transistor 2RQ1, the existence of the signal light can be detected at by the signal detection circuit 6.

The present circuit provides the voltage source 7 connected to the third terminal T3 within the optical receiver 10. This voltage source 7 can suppress the difference of the reference level for the signal detection attributed to the case whether the current monitoring circuit is externally connected to the terminal IMT or not. Namely, operating points of respective transistors in the current mirror circuit are defined by the current feedback due to the resistor connected to the emitter. In the case that the current flowing out from the emitter is large, the voltage difference between terminals of the resistor becomes large, which increases the electric potential of the emitter and, in other words, decreases the bias between the base and the emitter, thereby decreasing the base current and the corrector current, whereupon the voltage difference between terminals of the resistor decreases. Thus, some operating point of the transistor is automatically determined.

In the case that no voltage source is connected to the terminal T3 and no collector current flows into the transistor 2RQ2, the current served for the current feedback above described is only the base current of the transistor 2RQ2, which comes from the first terminal T1 of the current mirror circuit 2R. Accordingly, the collector current of the transistor 2RQ1 decreases as much as the base current of the transistor 2RQ2 increases, thereby decreasing the electric potential of the emitter of the transistor 2RQ1, namely the reference level of the signal detection is lowered.

According to the present embodiment, since the voltage source 7 is provided within the module, the collector current of the transistor 2RQ2 flows from the voltage source 7 even when no external function is provided in the current monitoring terminal IMT. The collector current and the base current flown from the first terminal T1 both contribute to the current feedback of the transistor 2RQ2 by the emitter resistor 8R2. Accordingly, the increase of the base current of the transistor 2RQ2 is suppressed, which results on the suppressing of the lowering of the signal detection level.

Next table compares the signal detection level of the present invention and the conventional configuration when the external ammeter is connected to the terminal IMT or not. As shown in the table, the signal detection level of the present invention is kept constant regardless of the voltage source 7, which results on the stable detection of the signal light. On the other hand, in the conventional configuration of no voltage source in the module, the signal detection level varies as much as 8.8 mV.

TABLE 1

|  | with current monitor | without current monitor | difference |
|---|---|---|---|
| Conventional | 25.2 mV | 16.4 mV | −8.8 mV |
| Present Invention | 22.0 mV | 22.0 mV | 0 mV |

In the present embodiment, the magnitude of the voltage source is set so as to provide a bias from 1.5V to 2.5V to the terminal T3. Since the saturation voltage of the forward biased diode is about 0.7V, the power supply in the voltage source is required to provide a potential from 2.2V to 3.2V. The external function connected to the current monitoring terminal IMT generally has an electric potential equal to or greater than 2.5V. In such a condition, the current from the external function becomes dominative because the diode connected to the terminal T3 is reverse-biased or zero-biased. On the other hand, when the external function connected to the terminal IMT has a magnitude smaller than 1.5V, or no external function is connected thereto, the current from the voltage source 7 becomes dominative.

Illustrating the optical receiver 10 as one embodiment, the invention and its application may be varied in many ways. The present configuration of the light receiving circuit is also applicable to an optical transceiver, in which optical connectors for light transmitting and light receiving fibers are provided. Further, other types of the current mirror circuit, such as a base current compensated type and a complementary type, are also applicable. Other types of semiconductor devices, such as MOS-FET, are usable in the present invention. Although the embodiment provides the voltage source 7 derived from the power supply Vcc within in the module, it may be preferable to provide another independent source. Such variations are not to be regarded as a departure from the spirit and scope of the invention, and all such modifications as would be obvious to one skilled in the art are intended for inclusion within the scope of the following claims.

What is claimed is:

1. An optical receiver, comprising:
a photo diode for receiving signal light and generating a photo current corresponding to the signal light;
a first current mirror circuit having a current path pair, the photo diode being connected to one current path;
a second current mirror circuit having a current path pair, a first terminal, a second terminal, a third terminal and a fourth terminal, the first and second terminals being connected to one of the paired current paths at each end thereof, the third and fourth terminal being connected to the other of the paired current paths at each end thereof, the first terminal being connected to the other of the paired current paths of the first current mirror circuit;
a signal detection circuit connected to the second terminal of the second current mirror circuit;
a current monitor terminal connected to the third terminal of the second current mirror circuit and connectable to an external ammeter; and
a voltage source connected to the third terminal of the second current mirror circuit for supplying a bias to the other of the paired current paths of the second current mirror circuits,
wherein the voltage source includes a power supply and a diode connected to the power supply.

2. The optical receiver according to claim 1, wherein the voltage source further comprises a first resistor and a second resistor serially connected to the first resistor, the first resistor being connected to the power supply and the diode, the second resistor being connected to the diode and a ground, the first and second resistors dividing the power supply and generating the bias.

3. The optical receiver according to claim 1, wherein the bias supplied from the voltage source is greater than 1.5V and smaller than 2.5V.

4. The optical receiver according to claim 1, wherein the photo diode is an avalanche photo diode.

5. The optical receiver according to claim 4, further comprising a high voltage source for supplying a bias potential to the photo diode, wherein the current path pair of the first current mirror circuit is connected to the high voltage source and the avalanche photo diode is biased by the high voltage source through the first current mirror circuit.

* * * * *